(12) United States Patent
Tsuchiko

(10) Patent No.: US 7,759,759 B2
(45) Date of Patent: Jul. 20, 2010

(54) INTEGRATED CIRCUIT INCLUDING A HIGH VOLTAGE BIPOLAR DEVICE AND LOW VOLTAGE DEVICES

(75) Inventor: Hideaki Tsuchiko, San Jose, CA (US)

(73) Assignee: Micrel Incorporated, San Jose, CA (US)

( * ) Notice: Subject to any disclaimer, the term of this patent is extended or adjusted under 35 U.S.C. 154(b) by 684 days.

(21) Appl. No.: 11/189,146

(22) Filed: Jul. 25, 2005

(65) Prior Publication Data
US 2005/0258496 A1 Nov. 24, 2005

Related U.S. Application Data

(62) Division of application No. 10/323,965, filed on Dec. 17, 2002, now Pat. No. 7,019,377.

(51) Int. Cl.
*H01L 29/47* (2006.01)
(52) U.S. Cl. .................. 257/471; 257/500; 257/509; 257/526; 257/552; 257/E27.009; 257/E27.016; 257/E27.017; 257/E27.064; 257/E27.068; 257/499; 257/476; 257/484; 257/491; 257/493
(58) Field of Classification Search .................. 257/500, 257/E27.064, 471, 476, 484, 491, 493, 499, 257/509, 526, 552, E27.001, E27.004, E27.009, 257/E27.016, E27.017, E27.068
See application file for complete search history.

(56) References Cited

U.S. PATENT DOCUMENTS

| | | | |
|---|---|---|---|
| 3,335,341 A | 8/1967 | Lin | |
| 4,697,332 A | 10/1987 | Joy et al. | |
| 4,887,142 A * | 12/1989 | Bertotti et al. | 257/338 |
| 4,918,026 A * | 4/1990 | Kosiak et al. | 438/207 |
| 4,979,001 A | 12/1990 | Alter | |
| 5,041,895 A * | 8/1991 | Contiero et al. | 257/370 |
| 5,047,820 A | 9/1991 | Garnett | |
| 5,158,463 A * | 10/1992 | Kim et al. | 438/205 |
| 5,225,359 A * | 7/1993 | DeLong | 438/328 |
| 5,242,841 A * | 9/1993 | Smayling et al. | 438/275 |
| 5,286,995 A * | 2/1994 | Malhi | 257/549 |
| 5,296,393 A * | 3/1994 | Smayling et al. | 438/275 |
| 5,355,014 A | 10/1994 | Rao et al. | |

(Continued)

OTHER PUBLICATIONS

S. Wolf, Silicon Processing for the VLSI Era vol. 2—Process Integration, Lattice Press, California, 1990, p. 313.*

*Primary Examiner*—Lynne A Gurley
*Assistant Examiner*—Meiya Li

(57) ABSTRACT

An integrated circuit includes a high voltage NPN bipolar transistor and a low voltage device. The NPN bipolar transistor includes a lightly doped p-well as the base region of the transistor while the low voltage devices are built using standard, more heavily doped p-wells. By using a process including a lightly doped p-well and a standard p-well, high and low voltage devices can be integrated onto the same integrated circuit. In one embodiment, the lightly doped p-well and the standard p-well are formed by performing ion implantation using a first dose to form the lightly doped p-well, masking the lightly doped p-well, and performing ion implantation using a second dose to form the standard p-well. The second dose is the difference of the dopant concentrations of the lightly doped p-well and the standard p-well. Other high voltage devices can also be built by incorporating the lightly doped p-well structure.

5 Claims, 7 Drawing Sheets

U.S. PATENT DOCUMENTS

| | | | |
|---|---|---|---|
| 5,387,552 A * | 2/1995 | Iranmanesh | 438/203 |
| 5,498,554 A * | 3/1996 | Mei | 438/200 |
| 5,539,237 A | 7/1996 | Todd et al. | |
| 5,556,796 A | 9/1996 | Garnett et al. | |
| 5,614,755 A * | 3/1997 | Hutter et al. | 257/471 |
| 5,698,457 A | 12/1997 | Noguchi | |
| 5,750,414 A | 5/1998 | Whitney | |
| 5,856,695 A * | 1/1999 | Ito et al. | 257/370 |
| 5,911,104 A * | 6/1999 | Smayling et al. | 438/202 |
| 5,913,114 A * | 6/1999 | Lee et al. | 438/202 |
| 6,096,589 A | 8/2000 | Lee et al. | |
| 6,127,213 A * | 10/2000 | Tung | 438/202 |
| 6,207,510 B1 | 3/2001 | Abeln et al. | |
| 6,306,700 B1 | 10/2001 | Yang | |
| 6,352,887 B1 * | 3/2002 | Hutter et al. | 438/202 |
| 6,410,377 B1 * | 6/2002 | Hwang et al. | 438/200 |
| 6,818,494 B1 * | 11/2004 | Chen et al. | 438/224 |
| 6,900,091 B2 * | 5/2005 | Williams et al. | 438/228 |
| 2002/0158277 A1 * | 10/2002 | Harada et al. | 257/288 |
| 2002/0185696 A1 * | 12/2002 | Beasom | 257/409 |
| 2003/0151109 A1 * | 8/2003 | Taniguchi et al. | 257/500 |
| 2003/0168710 A1 * | 9/2003 | Kim et al. | 257/500 |
| 2004/0033666 A1 * | 2/2004 | Williams et al. | 438/297 |

* cited by examiner

INTEGRATED CIRCUIT INCLUDING A HIGH VOLTAGE BIPOLAR DEVICE AND LOW VOLTAGE DEVICES

CROSS REFERENCE TO RELATED APPLICATION

This application is a divisional of application Ser. No. 10/323,965, filed Dec. 17, 2002 now U.S. Pat. No. 7,019,377, entitled "An Integrated Circuit including High Voltage Devices and Low Voltage Devices" of the same inventors hereof, which application is incorporated herein by reference in its entirety.

FIELD OF THE INVENTION

The invention relates to integration of high voltage and low voltage devices onto the same integrated circuit and, in particular, to integrating a high voltage Schottky barrier diode into an integrated circuit with other low voltage devices.

DESCRIPTION OF THE RELATED ART

High voltage integrated circuit devices are used in applications such as DC-DC converters or switching regulators which require voltages of 100 volts or greater. In most fabrication processes, integration of high voltage and low voltages devices into the same integrated circuit is difficult because manufacturing steps are typically optimized either for the low voltage devices or for the high voltage devices. Thus, devices of the opposite kind cannot be readily incorporated while still attaining the desired electrical properties. Methods to integrate low voltage and high voltage devices in an integrated circuit have been developed and applied. Usually, dedicated processing steps for the high voltage devices are added to the fabrication process so that both types of devices can be fabricated.

It is desirable to provide a manufacturing process where high voltage devices can be integrated with low voltage devices with minimal introduction of processing steps.

SUMMARY OF THE INVENTION

According to one embodiment of the present invention, an integrated circuit includes a high voltage Schottky barrier diode and a low voltage device. The Schottky barrier diode includes a lightly doped p-well as a guard ring while the low voltage devices are built using standard, more heavily doped p-wells. By using a process including lightly doped p-wells and standard p-wells, high voltage and low voltage devices can be integrated onto the same integrated circuit. In one embodiment, the lightly doped p-wells and the standard p-wells are formed by performing ion implantation using a first dose to form the lightly doped p-wells, masking the lightly doped p-wells, and performing ion implantation using a second dose to form the standard p-wells. The second dose is thus the difference of the dopant concentrations of the lightly doped p-wells and the standard p-wells.

According to another embodiment, an integrated circuit includes a high voltage p-channel lateral double-diffused metal-oxide-semiconductor (LDMOS) transistor and a low voltage device. The LDMOS transistor is formed using the lightly doped p-well as the drift region of the drain terminal.

According to another embodiment, an integrated circuit includes a high voltage npn bipolar transistor and a low voltage device. The bipolar transistor is formed using the lightly doped p-well as the base region of the transistor.

According to another embodiment, an integrated circuit includes a high voltage/high resistivity diffusion resistor and a low voltage device. The diffusion resistor is formed using the lightly doped p-well.

The present invention is better understood upon consideration of the detailed description below and the accompanying drawings.

DETAILED DESCRIPTION OF THE PREFERRED EMBODIMENTS

In accordance with the principles of the present invention, a high voltage Schottky barrier diode is integrated with low voltage devices in an integrated circuit where the Schottky barrier diode includes a lightly doped p-well as a guard ring while the low voltage devices are built using standard, more heavily doped p-wells. Besides the Schottky barrier diode, other high voltage devices (such as those for handling voltages greater than 100 volts) can also be built by incorporating the lightly doped p-well structure so that integration of high voltage devices and low voltage devices can be realized. The incorporation of both high voltage and low voltage devices in an integrated circuit reduces the manufacturing cost and the complexity of manufacturing integrated circuits including high voltage and low voltage devices.

In one embodiment, the high voltage (HV) Schottky barrier diode of the present invention is integrated with other low voltage devices on the same silicon substrate and fabricated using a BiCMOS (bipolar-complementary metal-oxide-semiconductor) process. The HV Schottky barrier diode includes a lightly doped p-well to form a linearly graded p-n junction guard ring structure at the periphery of aluminum to N-type Silicon contact. The guard ring structure functions to reduce the electric field at the periphery of the diode structure. The use of a p-n junction guard ring structure in a Schottky barrier diode to form a "hybrid" p-n junction-Schottky barrier diode is described by R. A. Zettler and A. M. Cowley in "p-n Junction-Schottky Barrier Hybrid Diode," IEEE Transactions On Electron Devices (January 1969, pp. 58-63), which reference is incorporated herein by reference in its entirety. In conventional application of the p-n junction-Schottky barrier hybrid diode structure, a dedicated p-type diffusion is used to form the guard ring structure. The use of a dedicated processing step adds complexity and cost to the fabrication process. In other conventional applications, to avoid manufacturing cost increase, a p-well that is standard to the fabrication process ("a standard p-well") is used to form the guard ring diffusion. However, when a standard p-well is used, the reverse breakdown voltage of the Schottky barrier diode cannot be tailored but rather is dictated by the implant dosage and profile of the standard p-well process.

In accordance with the present embodiment of the present invention, a lightly doped p-well which is formed in conjunction with standard p-wells is used to form the guard ring structure of the HV Schottky barrier diode. In this manner, at least one masking step is eliminated as compared to the conventional processes, thereby simplifying the fabrication process and reducing cost. Furthermore, the use of a lightly doped p-well for the guard ring allows the doping level of the p-n junction to be tailored so that a higher reverse breakdown voltage for the Schottky barrier diode can be achieved.

Figure 1A:
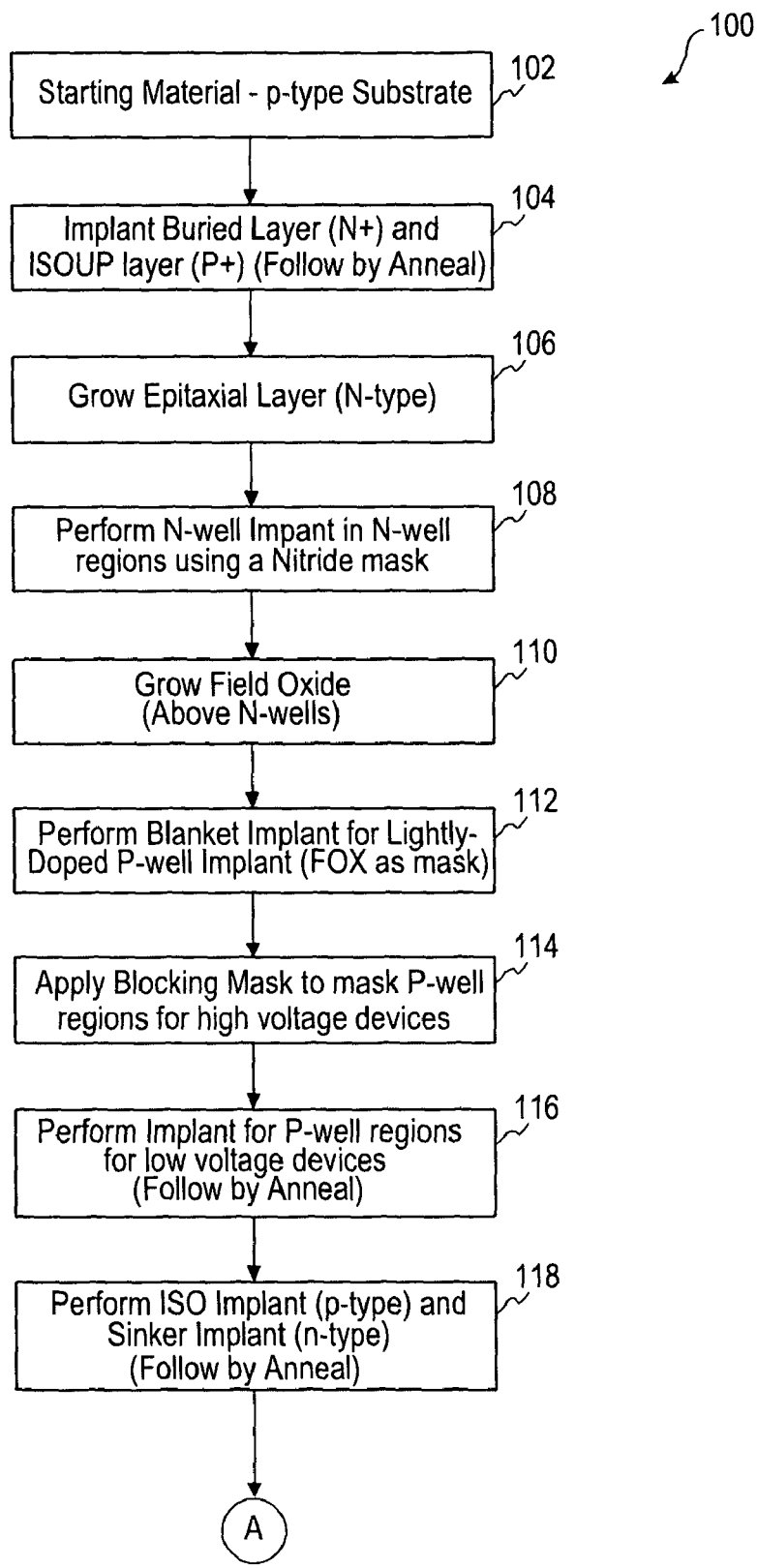
FIGS. 1A and 1B illustrate the fabrication process for forming a high voltage Schottky barrier diode in a BiCMOS (bipolar-complementary metal-oxide-semiconductor) process according to one embodiment of the present invention.
Figure 1B:
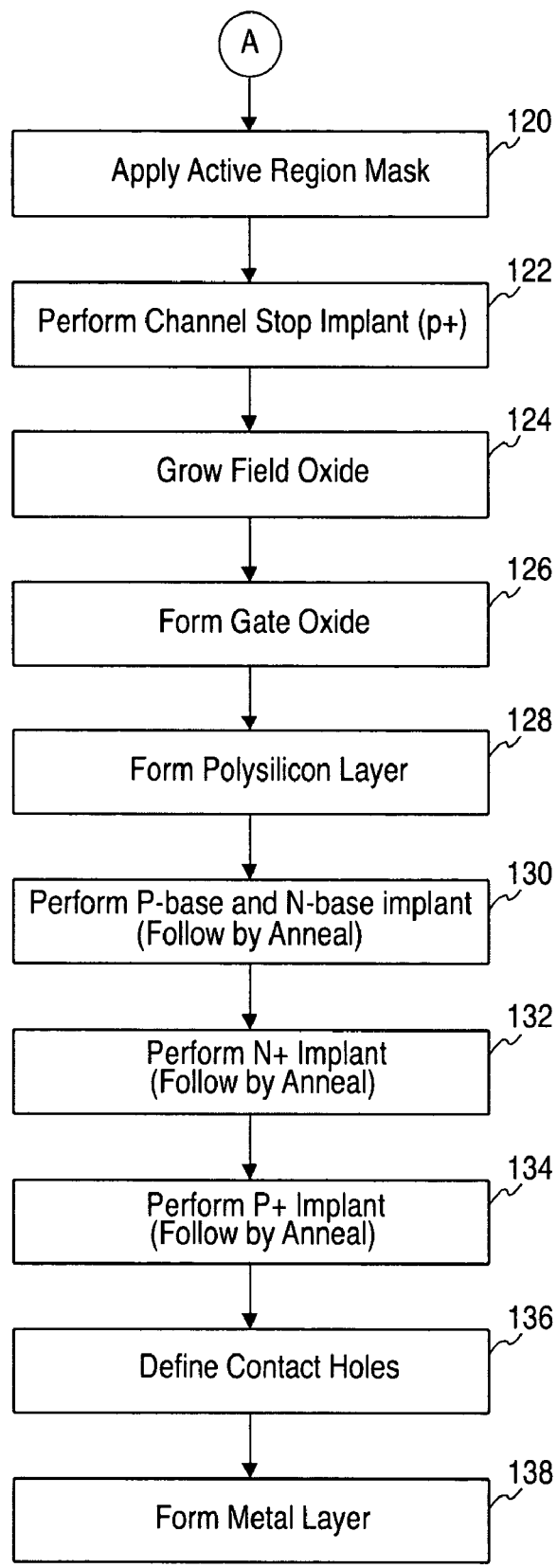
Figure 2:
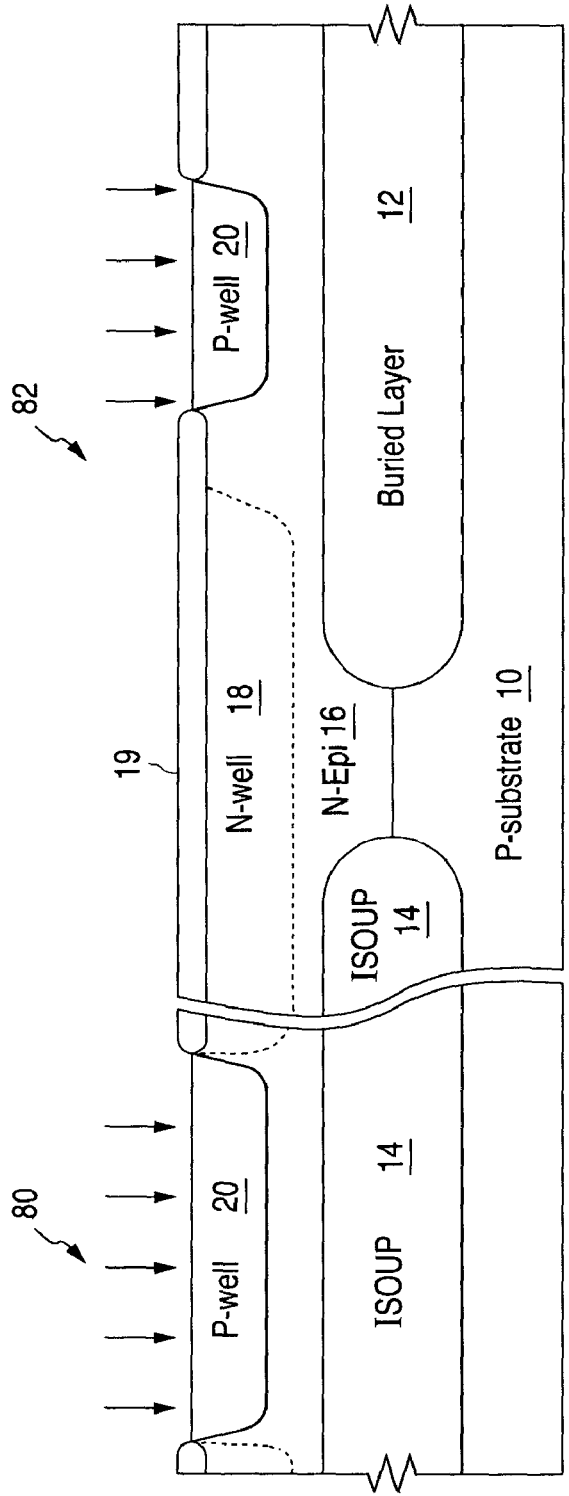
FIGS. 2-4 are cross-sectional views of a portion of an integrated circuit illustrating the process sequence for forming a high voltage Schottky barrier diode and a low voltage MOS transistor in accordance with the process of the present invention.
Figure 3:
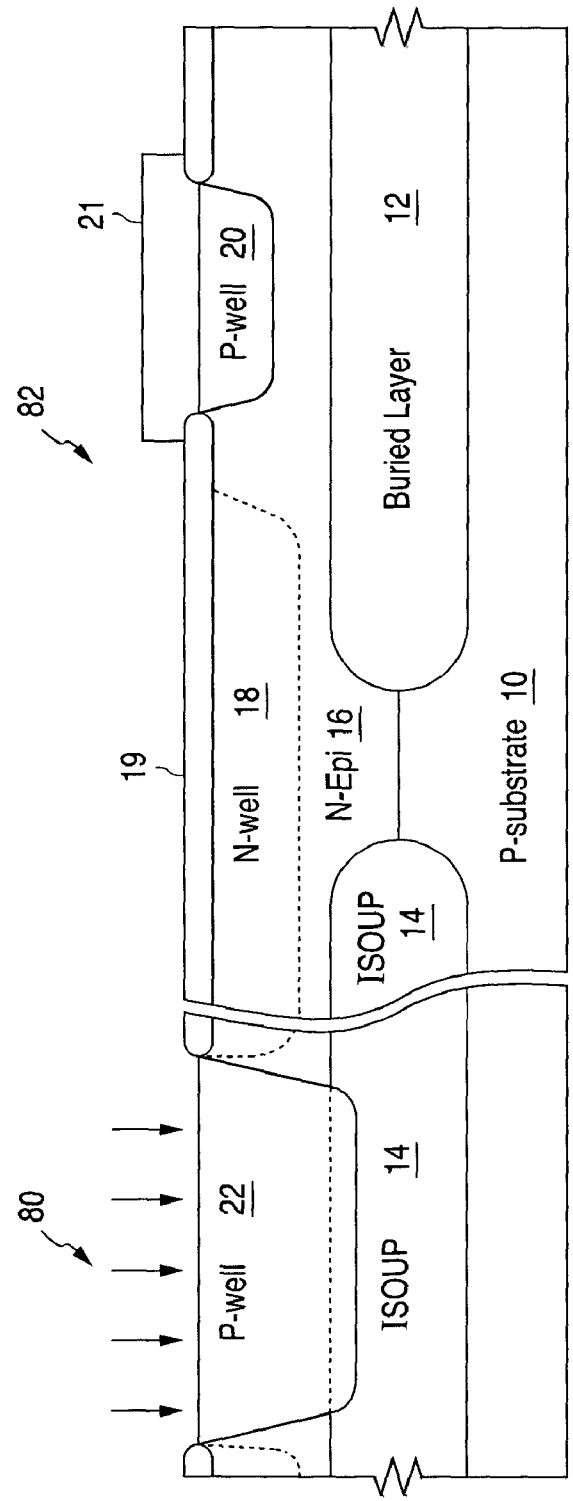
Figure 4:
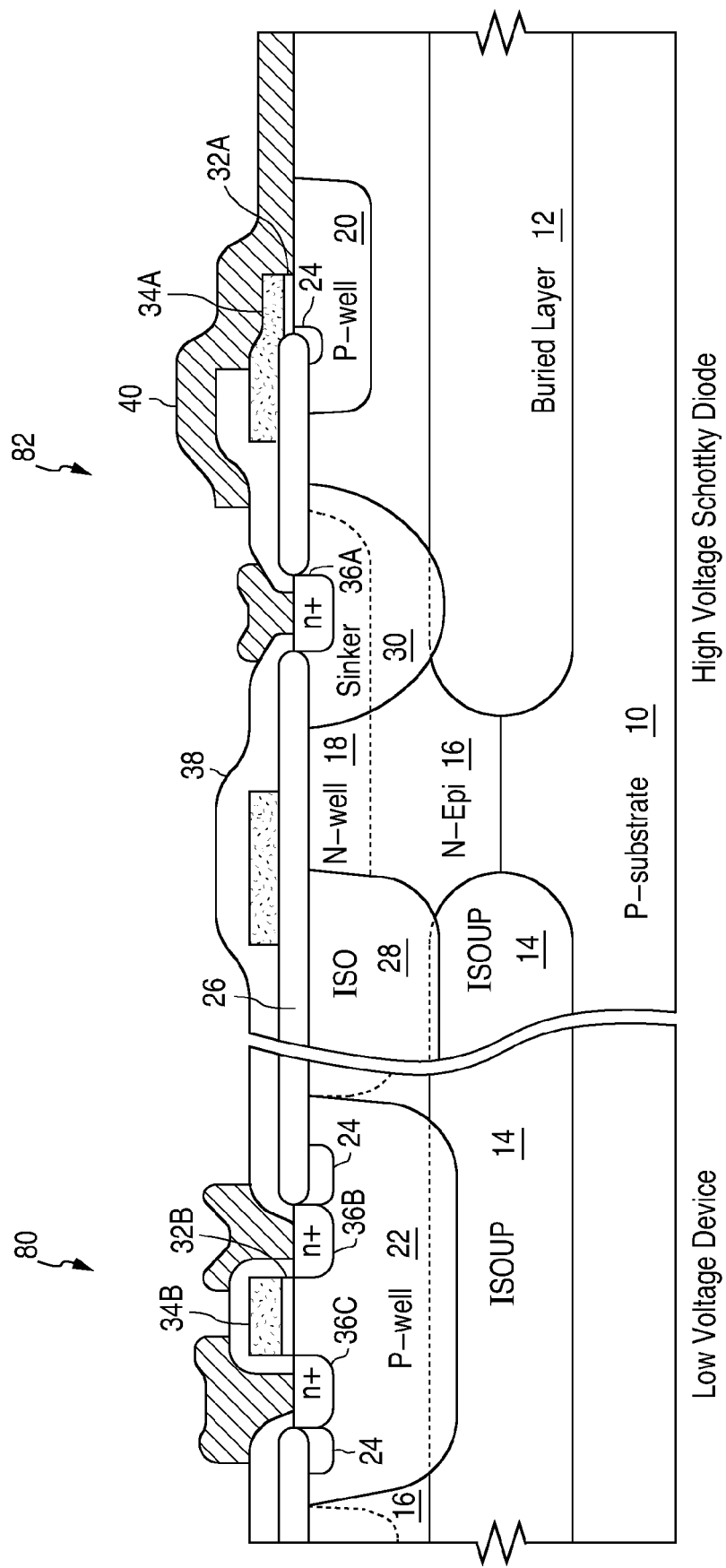

FIGS. 1A and 1B illustrate the fabrication process for forming a high voltage Schottky barrier diode and a low voltage MOS transistor in a BiCMOS process according to one embodiment of the present invention. FIGS. 2-4 are cross-sectional views of a portion of an integrated circuit illustrating the process steps for forming the Schottky barrier diode and the MOS transistor in accordance with the process of FIGS. 1A and 1B.

Referring to FIG. 1A and FIG. 2, fabrication process 100 starts with a p-type silicon substrate 10 (step 102). Substrate 10 includes a semiconductor region 80 in which a low voltage (LV) NMOS transistor is to be formed and a semiconductor region 82 in which a high voltage (HV) Schottky barrier diode is to be formed. Note that region 82 in FIGS. 2-4 illustrates only a portion of the HV Schottky barrier diode to be formed. In actual implementation, a HV Schottky barrier diode is typically formed in a symmetrical structure such that the cross-sectional view of the HV Schottky barrier diode in FIGS. 2-4 represents only one-half of the diode.

On substrate 10, a buried layer 12 with n-type impurities and an ISOUP (isolation up) layer 14 with p-type impurities are formed by conventional means, such as by ion implantation (step 104) followed by a thermal anneal. An n-type epitaxial layer 16 is then formed on substrate 10, also by conventional means (step 106). Next, a nitride mask is formed defining the n-well regions. Specifically, the nitride mask covers regions that are not to receive the n-well implants, such as the p-well regions and the anode region of the Schottky barrier diode to be formed. N-well implant is carried out to form the n-wells, such as n-well 18 in region 82 (step 108).

An oxidation process is then carried out to form a field oxide layer 19 (step 110). Openings in field oxide layer 19 define regions receiving the p-well implants. In the present embodiment, a two-step implantation process is carried out to form lightly doped p-well regions as well as standard p-well regions. First, a blanket implant using p-type impurities, such as boron, is performed to form lightly doped p-well regions 20 (step 112). The impurity dose for the lightly doped p-well implantation step is selected to optimize the electrical properties of the Schottky barrier diode or other high voltage devices to be built. In the present embodiment, the impurity dose for the lightly doped p-well implantation step is selected to be one-fifth of the standard p-well dose where the standard p-well dose is the impurity dose selected to optimize the electrical properties of the low voltage devices. In other embodiments, the lightly doped p-well dose can be one-tenth to nine-tenth of the standard p-well dose.

Referring to FIG. 3, after the lightly doped p-well implantation step, a blocking mask 21 is applied which covers areas where high voltage devices, such as the Schottky barrier diode, are to be built. Thus, mask 21 covers p-well 20 in region 82 in substrate 10 (step 114). Then, a second p-well implantation step is performed to apply the balance of the standard p-well dose to p-wells in regions where low voltage devices are to be built (step 116). As such, regions not covered by blocking mask 21 receive the additional p-well implant. In the present embodiment, the balance of the standard p-well dose is four-fifth of the standard p-well dose. Thus, the second p-well implantation step is applied to region 80 to convert lightly doped p-well 20 previously formed to a standard p-well 22. As a result of the two implantation steps, p-well 22 receives a total of the standard p-well dose and can be used to form low voltage devices. Following the implantation steps, anneal is performed to drive in the dopants, as is done in conventional processes.

FIG. 4 and the subsequent process steps in FIGS. 1A and 1B illustrate the process steps for forming a LV NMOS transistor and a HV Schottky barrier diode on substrate 10 in the BiCMOS fabrication process according to the present invention. Referring to FIG. 4, after formation of the p-wells 20 and 22, regions for receiving sinker and ISO implantation are defined. Then, implantation steps to form an ISO region 28 using p-type impurities and a sinker region 30 using n-type impurities are carried out (step 118). ISO region 28 functions as an isolation structure for the device built in region 82. Sinker region 30 forms part of a low-resistance contact for the cathode of the HV Schottky diode to be formed in region 82. Anneal is performed after the implantations steps. In other embodiments, the ISO regions can be formed using the same processing steps as P-well 22, thus obviating additional processing steps.

Then, referring to FIG. 1B, an active region mask is applied to define the active regions (step 120). A field implant is performed to form heavily doped p+ regions 24 (step 122). Subsequently, a field oxidation process is carried out to form field oxide layer 26 defining the active regions and the region for forming the HV Schottky barrier diode (step 124). The heavily doped p+ regions 24 are positioned under the field oxide layer in p-wells 20 and 22 and function to increase field threshold voltage at the respective locations.

Next, an oxidation process is carried out to form a gate oxide layer (step 126). A polysilicon layer is formed on the gate oxide layer, such as by chemical vapor deposition (step 128). The polysilicon layer 34 and the oxide layer are subsequently patterned for forming different devices on substrate 10. For instance, polysilicon layer 34A, insulated from the substrate by oxide layer 32A, forms a field plate for the HV Schottky diode to be built in region 82, and polysilicon layer 34B, insulated from the substrate by oxide layer 32B, forms the gate terminal of the LV NMOS transistor to be built in region 80.

In the present embodiment, fabrication process 100 is a BiCMOS process. Thus, fabrication process 100 continues with a p-base and n-base implantation steps (step 130) for forming base regions where bipolar transistors are to be built in substrate 10 (not shown in FIG. 4). An anneal process follows the implantation steps to drive in the implanted dopants. Then, an n+ implant step is carried out to form the n+ regions of the CMOS devices (step 132). Anneal is performed after the implantation. Referring to FIG. 4, the n+ implant step forms an n+ region 36A in region 82 which functions as the cathode contact of the HV Schottky barrier diode to be built. The n+ implant step also forms n+ regions 36B and 36C which are the source and drain regions of the LV NMOS transistor in region 80. N+ regions can also be formed to function as the N-well body contacts of LV PMOS transistors (not shown).

Subsequent to the n+ implant step, a p+ implant step followed by anneal is carried out to form p+ regions in substrate 10 (step 134). The p+ regions are used, for example, to form the source and drain regions of LV PMOS transistors on substrate 10 and to form P-well contacts of LV NMOS transistors that are formed in P-wells 22 (not shown in FIG. 4).

Next, a dielectric layer 38, such as BPSG (borophosphosilicate glass), is deposited onto substrate 10 and contact holes to the Schottky diode anode region, n+ diffusion regions 36A, 36B and 36C, and p+ diffusion regions are formed (step 136). Then, a metal layer 40 is deposited and patterned to form conductive lines for the devices on substrate 10 (step 138). In the present embodiment, a portion of metal layer 40 is in contact with a portion of P-well 20 and n-type epitaxial layer 16 for forming the anode of a HV Schottky barrier diode in region 82.

Fabrication process 100 may further include other process steps not shown in FIGS. 1A and 1B. For example, subsequent to metallization, fabrication process 100 may include process steps to add additional metal interconnect layers and process steps to form a passivation layer over the entire substrate 10 for protection.

FIG. 4 illustrates the resultant structure of a HV Schottky diode form in region 82 and a LV NMOS transistor form in region 80. The HV Schottky diode in region 82 is formed by metal layer 40 as the anode and n-type epitaxial layer 16 as the cathode. Lightly doped p-well 20 forms a guard ring structure surrounding the anode edge of the HV Schottky diode. P-well 20 has the effect of reducing the electric field at the anode edge of the Schottky diode, thereby increasing the reverse bias breakdown voltage of the diode. Furthermore, because lightly doped p-well 20 has a lower dopant concentration and a shallower junction than standard p-well 22, the buried layer reach-through breakdown voltage of the diode is increased as compared to conventional devices, thereby increasing the reverse bias breakdown voltage of the HV Schottky diode.

When a standard p-well is used for the guard ring, the reverse bias breakdown voltage of the Schottky barrier diode is limited by the standard P-well to N+ buried-layer 12 reach-through voltage. In conventional processes, the reach-through breakdown voltage is about 80 volts, limiting the breakdown voltage of the high voltage Schottky diode. In the present embodiment, when a lightly doped p-well is used as the guard ring, the reach-through breakdown voltage can be increased to 120 volts, representing a significant improvement over the conventional processes.

In summary, a high voltage Schottky barrier diode is integrated with low voltage devices in an integrated circuit and is able to achieve very high breakdown voltages by using a lightly doped p-well guard ring structure. The magnitude of improvement in the breakdown voltage characteristics that can be achieved using the Schottky barrier diode structure of the present invention cannot be readily realized in conventional fabrication processes. Although dual well or multiple-step p-well processes are known in the art, these dual well or multiple-step p-well processes are generally used for the purpose of building NMOS transistors with different voltage ratings. The advantageous application of a dual p-well process for integrating a HV Schottky barrier diode on the same integrated circuit as other low voltage devices has not been appreciated by others prior to the present invention.

In accordance with another aspect of the present invention, the Schottky barrier diode and the low voltage devices are built on a substrate including an epitaxial layer with increased thickness. By increasing the thickness of the epitaxial layer, the distance between the bottom of the lightly doped p-well guard ring and the top of the n-type buried layer is increased, thereby further increasing the P-well to buried layer reach-through breakdown voltage. For instance, when a 1 micron thicker epitaxial layer is used, a breakdown voltage of 135 volts can be realized at the high voltage Schottky barrier diode.

In the above description, a lightly doped p-well and a standard p-well process is used to integrate a high voltage Schottky barrier diode with low voltage devices in a BiCMOS process. However, the above description is illustrative only. One of ordinary skill in the art, upon being apprised of the present invention, would appreciate that the combination of a lightly doped p-well and a standard p-well can be used to manufacture a variety of high voltage devices. Furthermore, the combination of a lightly doped p-well and a standard p-well can be applied to other types of fabrication processes, such as CMOS processes, for integrating high voltage devices and low voltage devices. The following description illustrates various high voltage devices which can incorporate a lightly doped p-well for enhancing the operational characteristics of the high voltage devices.

Figure 5:
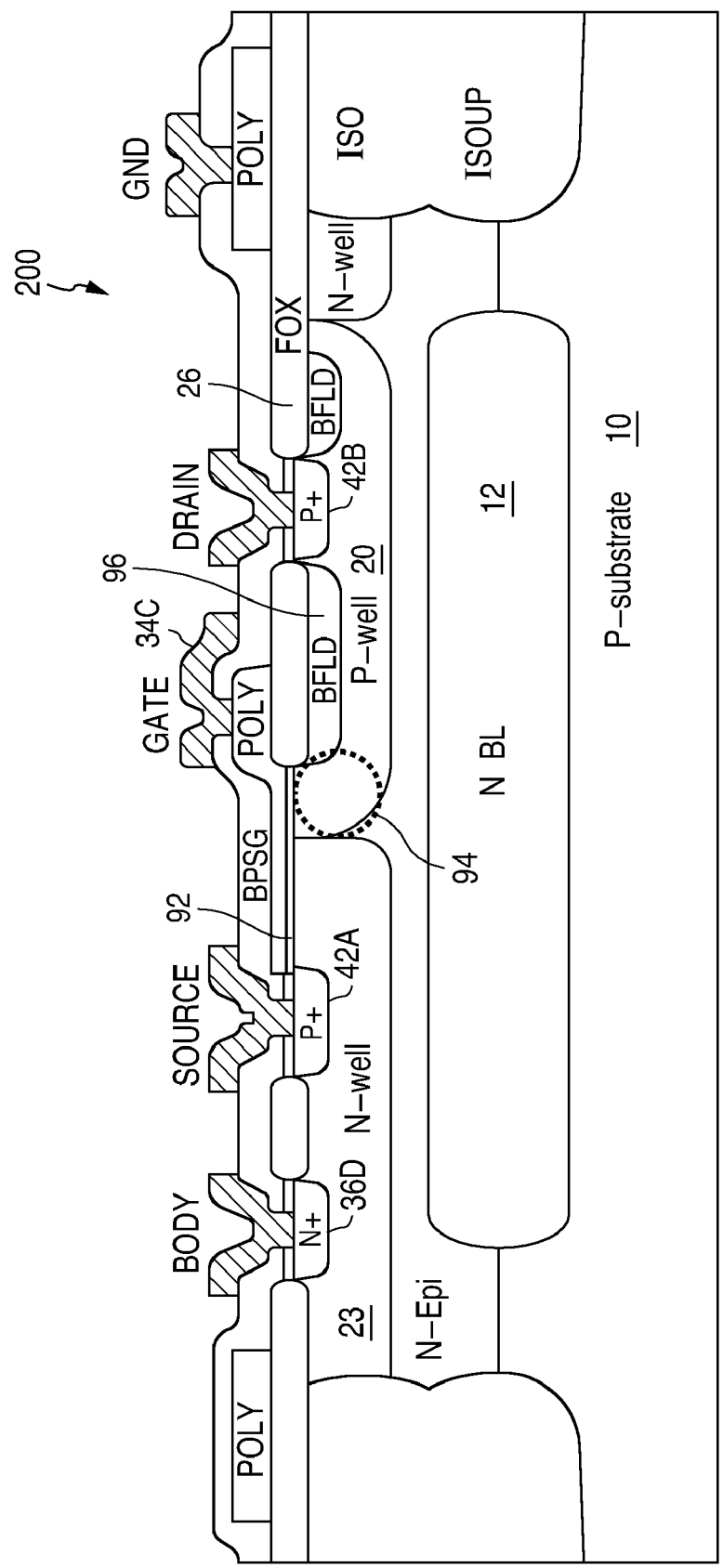
FIG. 5 is a cross-sectional view of a p-type LDMOS field effect transistor (FET) according to one embodiment of the present invention.

In an alternate embodiment of the present invention, a p-type lateral double-diffused metal-oxide-semiconductor (LDMOS) field effect transistor (FET) incorporates a lightly doped p-well as the drain-side drift region of the transistor. FIG. 5 is a cross-sectional view of a p-type LDMOS field effect transistor (FET) according to one embodiment of the present invention. By using a process including a combination of lightly doped p-wells and standard p-wells, p-type LDMOS transistor 200 can be integrated with other high voltage devices, such as a HV Schottky barrier diode, and other low voltage devices on the same integrated circuit. In the present embodiment, p-type LDMOS transistor 200 is assumed to be formed on the same substrate as the HV Schottky barrier diode of FIG. 4. Thus, like elements in FIGS. 4 and 5 will be given like reference numerals.

Referring to FIG. 5, p-type LDMOS transistor 200 includes, among other things, a p+ diffusion region 42A as the source, an N-well 23 as the body (the channel region), a p+ diffusion region 42B as the drain, and a polysilicon gate 34C as the gate conductor. An N+ region 36D forms the body contact for LDMOS transistor 200. Field oxide (FOX) 26 encircles LDMOS transistor 200. LDMOS transistor 200 further includes a lightly doped p-well region 20 formed between the body and the drain terminal of the transistor. P-well 20 thus forms a drain-side drift region of LDMOS transistor 200. By using a lightly doped p-well in the drain drift region, the breakdown voltage of the LDMOS transistor can be increased accordingly. In the present embodiment, boron field implant (BFLD) 96 is formed under the field oxide layer in P-well 20.

In another embodiment of the present invention, a native threshold voltage (zero volt) n-type MOS FET is built using a lightly doped p-well as the body. When an NMOS transistor is formed in a standard p-well, the threshold voltage of the NMOS transistor is about 0.8 to 1 volt. When the lightly doped p-well is used to form the body of the NMOS transistor, a native threshold voltage transistor having a threshold voltage of zero volts can be realized. In addition, the n+ drain to lightly doped P-well-body breakdown voltage becomes higher than the n+ drain to standard P-well-body breakdown voltage. Thus, the operating voltage of the NMOS transistor increases accordingly. The native threshold voltage NMOS transistor using a lightly doped p-well body can be integrated with other high voltage and low voltages devices on the same substrate.

Figure 6:
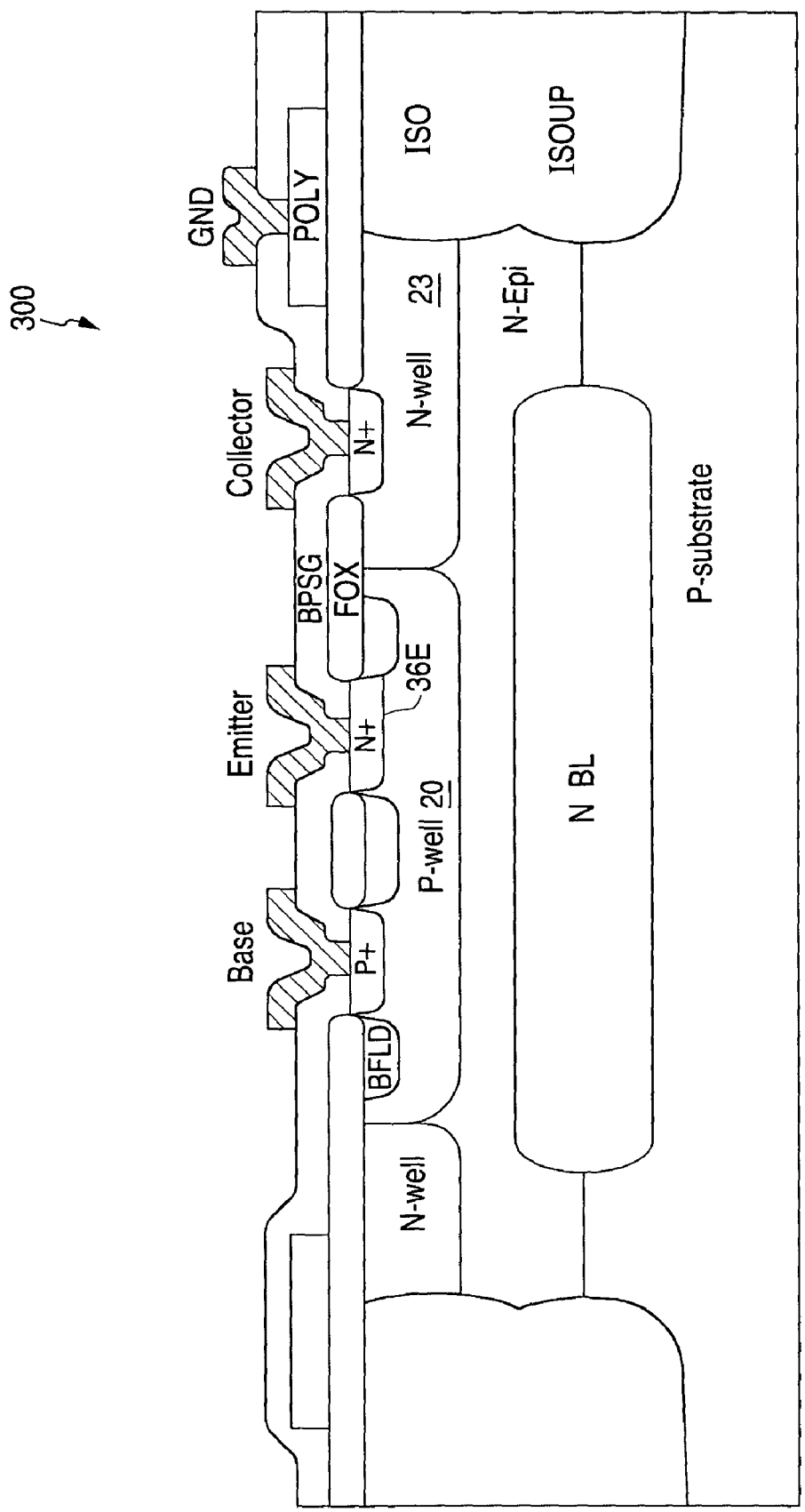
FIG. 6 is a cross-sectional view of a vertical NPN bipolar transistor according to one embodiment of the present invention.

In yet another embodiment, a high voltage vertical NPN bipolar transistor is built using a lightly doped p-well as the base region of the NPN bipolar transistor. FIG. 6 is a cross-sectional view of a vertical NPN bipolar transistor according to one embodiment of the present invention. In the present embodiment, NPN bipolar transistor 300 is assumed to be formed on the same substrate as the HV Schottky barrier diode of FIG. 4. Thus, like elements in FIGS. 4 and 6 will be given like reference numerals. Referring to FIG. 6, NPN bipolar transistor 300 includes, among other things, a n+ diffusion region 36E as the emitter, a lightly doped p-well region 20 as the base and an N-well 23 as the collector. The use of lightly doped p-well 20 as the base region of bipolar transistor 300 eliminates the use of a dedicated p-base diffusion step, thus simplifying the integration of bipolar transistors in a CMOS or BiCMOS process.

Figure 7:
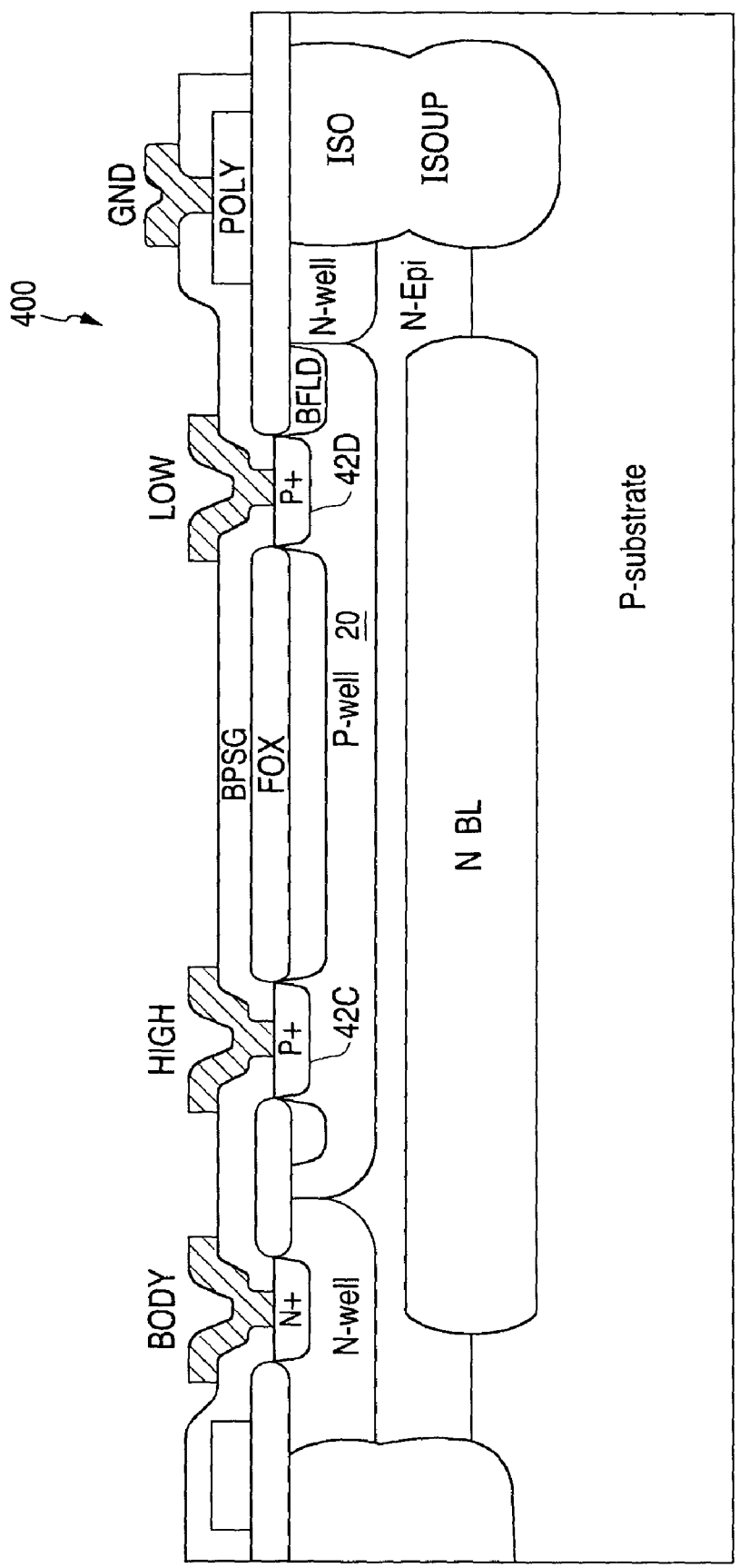
FIG. 7 is a cross-sectional view of a high resistivity/high voltage p-well resistor according to one embodiment of the present invention.

Lastly, the lightly doped p-well region can also be used to form high resistivity or high voltage diffusion resistors, as illustrated in FIG. 7. Referring to FIG. 7, p-well 20 is used to form a diffusion resistor 400 where p+ diffusion regions 42C and 42D form the two terminals of the resistor. By using a lightly doped p-well as the resistor, instead of using the standard p-well having higher dopant concentration, resistor 400 can be made to withstand higher voltage levels and thus can be used in high voltage applications.

The above detailed descriptions are provided to illustrate specific embodiments of the present invention and are not intended to be limiting. Numerous modifications and variations within the scope of the present invention are possible. The present invention is defined by the appended claims.

I claim:

1. An integrated circuit comprising:
a high voltage (HV) Schottky barrier diode formed in a first region in a semiconductor layer of a first conductivity type, the first region comprising an epitaxial layer of the first conductivity type acting as a cathode of the HV Schottky barrier diode, the HV Schottky barrier diode comprising:
a metal layer acting as an anode of the HV Schottky barrier diode; and
a first well of a second conductivity type, the first well forming a guard ring surrounding an anode edge of the HV Schottky barrier diode; and
a low voltage device formed in a second region in the semiconductor layer, the low voltage device being formed in a second well of the second conductivity type in the semiconductor layer,
wherein the second well is more heavily doped than the first well, the doping level of the first well being selected to provide a breakdown voltage for the HV Schottky barrier diode that is higher than a breakdown voltage of the low voltage device; and
wherein the HV Schottky barrier diode is isolated in the first region by using an iso region of the second conductivity type.

2. The integrated circuit of claim 1, wherein the first well has a first dopant concentration and the second well has a second dopant concentration, the second well is formed by receiving implantations of dopants having the first dopant concentration and by receiving subsequent implantation of dopants having a concentration equaling to the difference between the first dopant concentration and the second dopant concentration.

3. The integrated circuit of claim 1, wherein the first well has a first dopant concentration selected to optimize electrical properties of the HV Schottky barrier diode and the second well has a second dopant concentration selected to optimize electrical properties of the low voltage device.

4. The integrated circuit of claim 1, wherein the low voltage device comprises a MOS field effect transistor formed in the second well.

5. The integrated circuit of claim 1, wherein the first conductivity type is n-type conductivity and the second conductivity type is p-type conductivity.

* * * * *